(12) United States Patent
Chiu et al.

(10) Patent No.: US 7,492,220 B2
(45) Date of Patent: Feb. 17, 2009

(54) METHODS FOR CONTROLLING POWER STAGE OF POWER AMPLIFIER AND RELATED APPARATUSES

(75) Inventors: Shu-Yeh Chiu, Hsinchu County (TW); Po-Chiang Wu, Hsinchu County (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 11/850,664

(22) Filed: Sep. 5, 2007

(65) Prior Publication Data

US 2008/0122535 A1 May 29, 2008

(30) Foreign Application Priority Data

Nov. 27, 2006 (TW) .............................. 95143717 A

(51) Int. Cl.
*H03F 3/38* (2006.01)
(52) U.S. Cl. ....................................... 330/10; 330/251

(58) Field of Classification Search ................. 330/10, 330/251, 207 A
See application file for complete search history.

(56) References Cited

U.S. PATENT DOCUMENTS 7,209,002 B2 * 4/2007 Ohkuri et al. ................. 330/10
7,292,171 B2 * 11/2007 Heeb ........................... 341/143
7,391,346 B1 * 6/2008 Determan et al. ............. 341/53

\* cited by examiner

*Primary Examiner*—Henry K Choe
(74) *Attorney, Agent, or Firm*—Winston Hsu

(57) ABSTRACT

A controller of a power amplifier includes an oversampler for oversampling an incoming digital signal to generate an oversampled signal, a controlling module for generating a first control signal and a second control signal according to the oversampled signal, a PWM circuit for generating a first PWM signal according to the first control signal, and a pulse width adjuster for adjusting a pulse width of the first PWM signal according to the second control signal to generate a second PWM signal for controlling a power stage of the power amplifier.

21 Claims, 8 Drawing Sheets

METHODS FOR CONTROLLING POWER STAGE OF POWER AMPLIFIER AND RELATED APPARATUSES

BACKGROUND OF THE INVENTION

1. Field of the Invention

The present invention relates to audio processing techniques, and more particularly, to methods for controlling a power stage of a power amplifier and related apparatuses.

2. Description of the Prior Art

Digital power amplifiers, or so-called class-D power amplifiers, are commonly applied in audio processing devices due to their high efficiency. A digital audio power amplifier utilizes a pulse width modulation (PWM) circuit to generate a PWM signal for controlling the operation of its power stage according to an incoming digital signal.

Performance of the digital audio power amplifier relates to resolution (i.e. bit number) of the PWM circuit. In general, the performance of the digital audio power amplifier improves as the resolution of the PWM circuit increases. However, a conventional PWM circuit must operate at a higher frequency to raise the resolution. From the viewpoint of manufacturing, raising operation frequency means increasing production difficulty and cost. In consideration of production cost, the performance of the digital audio power amplifier is restricted by manufacturing limitations, and therefore the performance is difficult to be improved.

SUMMARY OF THE INVENTION

One objective of the present invention is therefore to provide methods for controlling a power stage of an audio power amplifier and related apparatuses to solve the problems mentioned above.

According to an exemplary embodiment of the present invention, a controller of a power amplifier is disclosed. The controller includes an oversampler for oversampling an incoming digital signal to generate an oversampled signal, a controlling module for generating a first control signal and a second control signal according to the oversampled signal, a PWM circuit for generating a first PWM signal according to the first control signal, and a pulse width adjuster for adjusting a pulse width of the first PWM signal according to the second control signal to generate a second PWM signal for controlling a power stage of the power amplifier.

According to another exemplary embodiment of the present invention, a method for controlling a power stage of a power amplifier is disclosed. The method includes oversampling an incoming digital signal to generate an oversampled signal, generating a first control signal and a second control signal according to the oversampled signal, generating a first PWM signal according to the first control signal, and adjusting a pulse width of the first PWM signal according to the second control signal to generate a second PWM signal for controlling the power stage of the power amplifier.

According to another exemplary embodiment of the present invention, a power amplifier is disclosed. The power amplifier includes an oversampler, a controlling module, a PWM circuit, a power stage, and a pulse width adjuster. The oversampler is for oversampling an incoming digital signal to generate an oversampled signal. The controlling module is coupled to the oversampler, and is for generating a first control signal and a second control signal according to the oversampled signal, wherein a bit number of the first control signal is less than that of the oversampled signal. The PWM circuit is coupled to the controlling module, and is for generating a first PWM signal according to the first control signal. The pulse width adjuster is coupled to the controlling module, the PWM circuit and the power stage, and is for adjusting a pulse width of the first PWM signal according to the second control signal to generate a second PWM signal for driving the power stage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
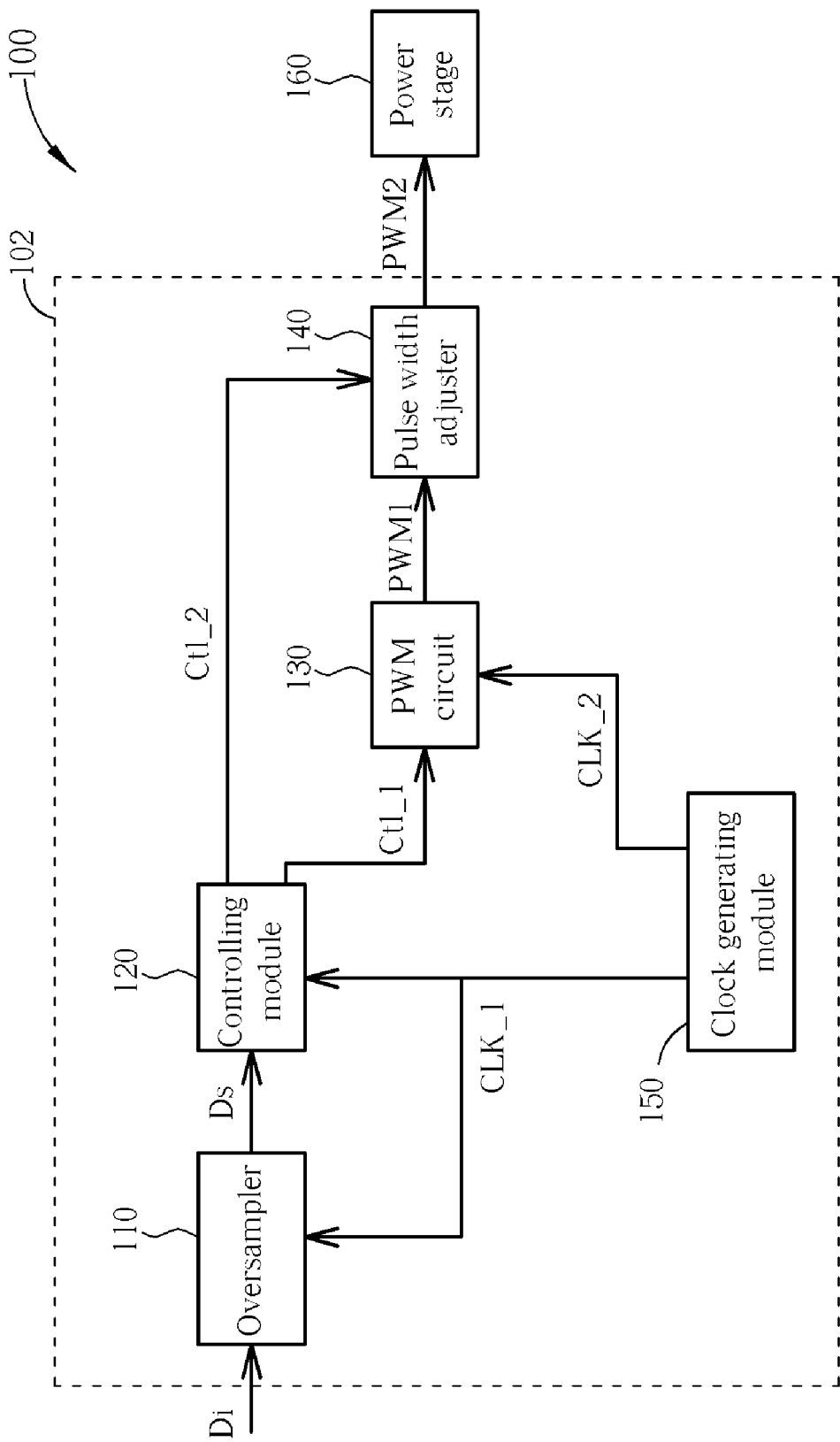
FIG. 1 is a simplified diagram of an audio power amplifier according to a exemplary embodiment of the present invention.

Please refer to FIG. 1, which is a diagram of an audio power amplifier 100 according to an exemplary embodiment of the present invention. As shown in FIG. 1, the audio power amplifier 100 includes a controller 102 and a power stage 160, where the power stage 160 is often implemented by a switching power stage. In this embodiment, the controller 102 includes an oversampler 110, a controlling module 120, a PWM circuit 130, a pulse width adjuster 140, and a clock generating module 150. The clock generating module 150 generates a first working clock CLK_1 for the oversampler 110 and for the controlling module 120, and a second working clock CLK_2 for the PWM circuit 130. The frequency of the first working clock CLK_1 is F1, while the frequency of the second working clock CLK_2 is F2 higher than F1. The clock generating module 150 can be implemented by utilizing a phase lock loop to generate the second working clock CLK_2, and utilizing a frequency divider to generate the first working clock CLK_1 having a lower frequency by dividing the frequency of the second working clock CLK_2. The following will introduce the operations and implementations of the controller 102 in conjunction with FIG. 2.

Figure 2:
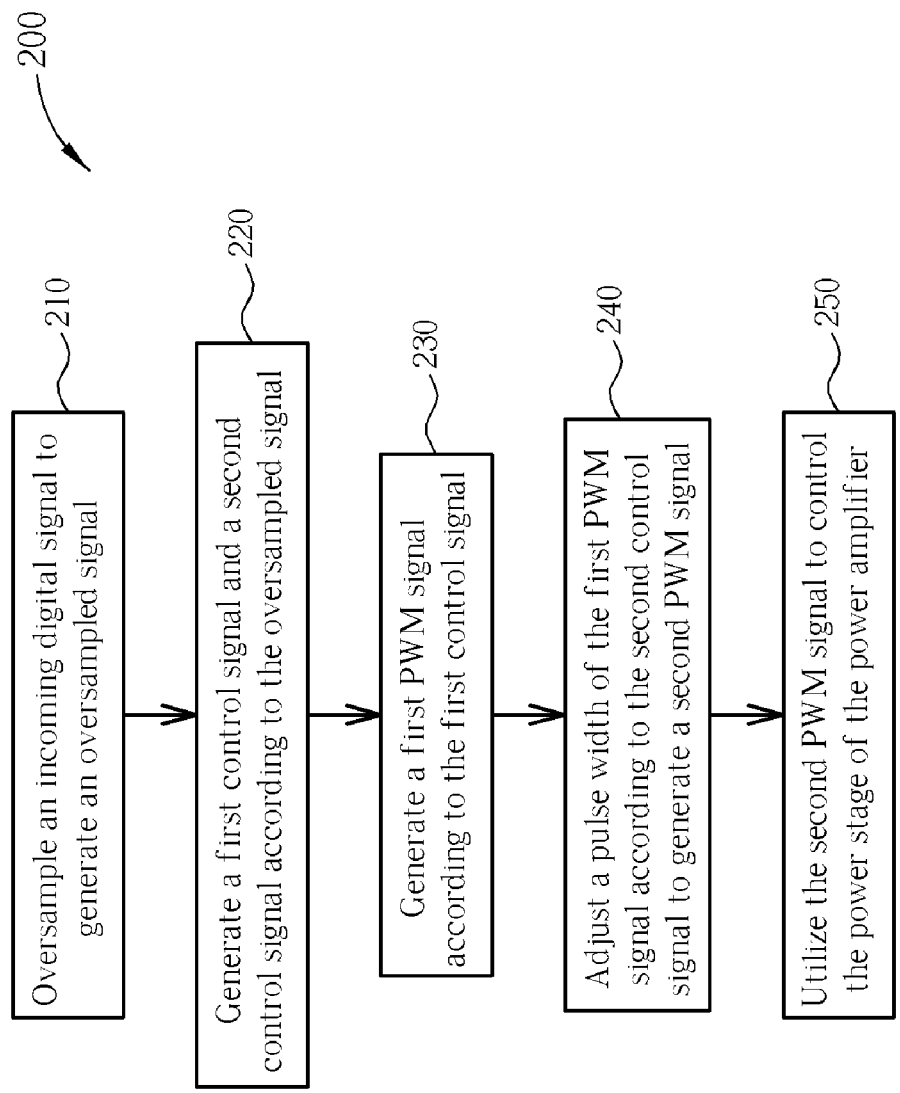
FIG. 2 is a flow chart representing a method for controlling the power stage in FIG. 1 according to an exemplary embodiment of the present invention.

FIG. 2 is a flow chart 200 of a method for controlling the power stage 160 according to an exemplary embodiment of the present invention. The steps of the flow chart 200 are introduced as below:

In step 210, the oversampler 110 receives an N1-bit digital audio signal Di having a frequency F0, and oversamples the digital audio signal Di according to the first working clock CLK_1 to generate an N1-bit oversampled signal Ds having a frequency F1, where F1 is larger than F0.

In step 220, the controlling module 120 generates an N2-bit first control signal Ctl_1 having a frequency F and an N3-bit second control signal Ctl_2 having a frequency F1 according to the oversampled signal Ds, wherein $N1 > N2 \geq N3 \geq 1$.

Figure 3:
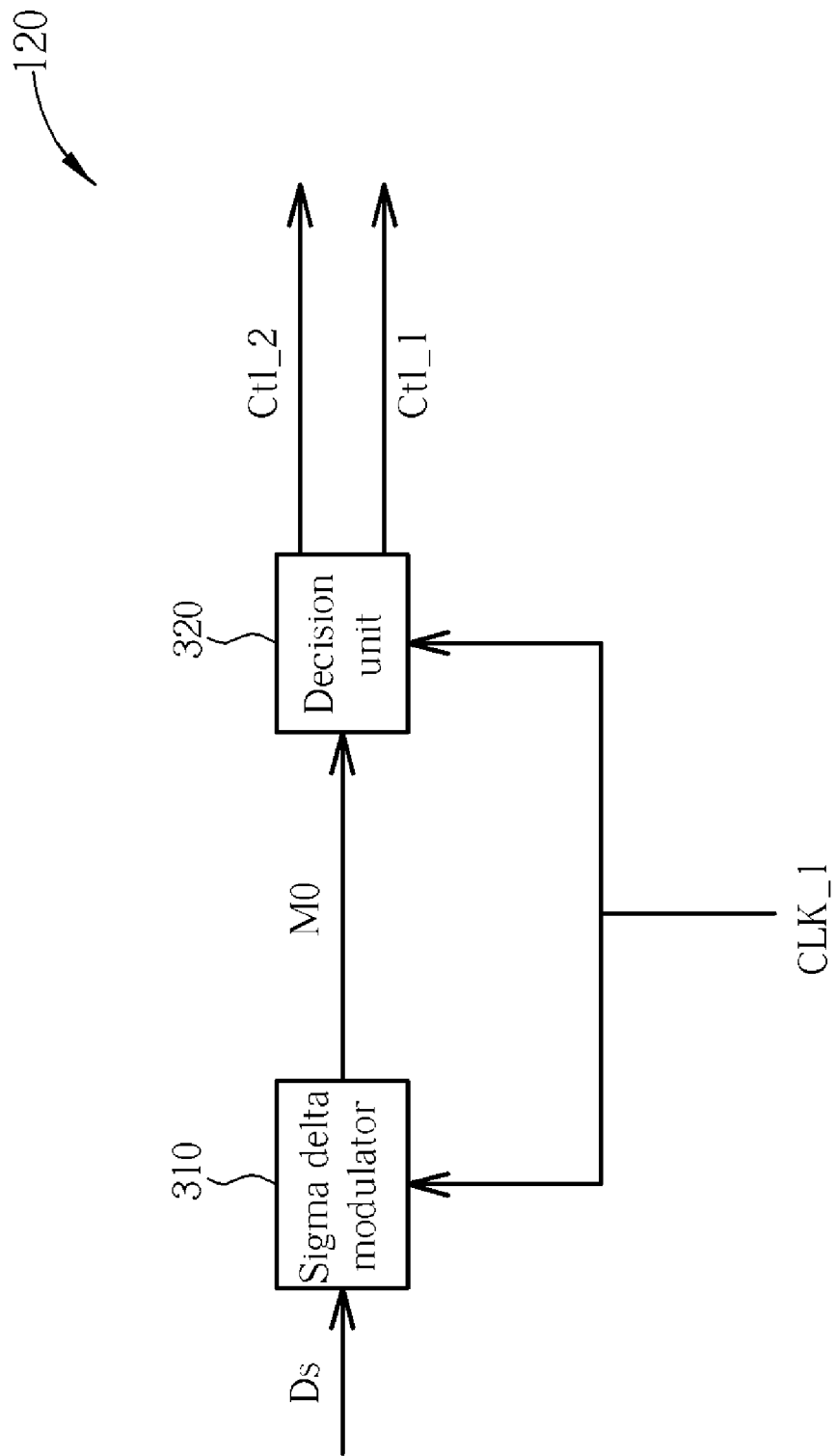
FIG. 3 is a simplified diagram of a controlling module in FIG. 1 according to a first embodiment of the present invention.

Please refer to FIG. 3, which illustrates a simplified diagram of the controlling module 120 according to a first embodiment of the present invention. As shown in FIG. 3, the controlling module 120 includes an N4-bit sigma delta modulator 310 and a decision unit 320, where $N4 = N2 + N3$, and $N4 < N1$. The sigma delta modulator 310 is for performing a sigma delta modulation on the oversampled signal Ds to generate an N4-bit modulated signal M0. In processing, the sigma delta modulator 310 can reduce the bit number of the digital audio signal and shape the noise.

Next, the decision unit 320 generates the first control signal Ctl_1 and the second control signal Ctl_2 according to the modulated signal M0 outputted from the sigma delta modulator 310. In implementation, the decision unit 320 can generate the first control signal Ctl_1 according to most significant bits of the modulated signal M0, and generate the second control signal Ctl_2 according to at least one least significant bit of the modulated signal M0. For example, in one embodiment, the decision unit 320 outputs N2 most significant bits of the modulated signal M0 as the first control signal Ctl_1, and outputs N3 least significant bits of the modulated signal M0 as the second control signal Ctl_2. In this embodiment, the decision unit 320 can be implemented by a de-multiplexer.

Then, in step 230, the PWM circuit 130 generates a one-bit first PWM signal PWM1 having a frequency F2 according to the first control signal Ctl_1, where $F2 = 2^{N2} \times F1$.

In step 240, the pulse width adjuster 140 adjusts a pulse width of the first PWM signal PWM1 to generate a second PWM signal PWM2 according to the instruction of the second control signal Ctl_2 generated by the controlling module 120. The following will further describe the implementations and processes of the pulse width adjuster 140 with respect to FIG. 4.

Figure 4:
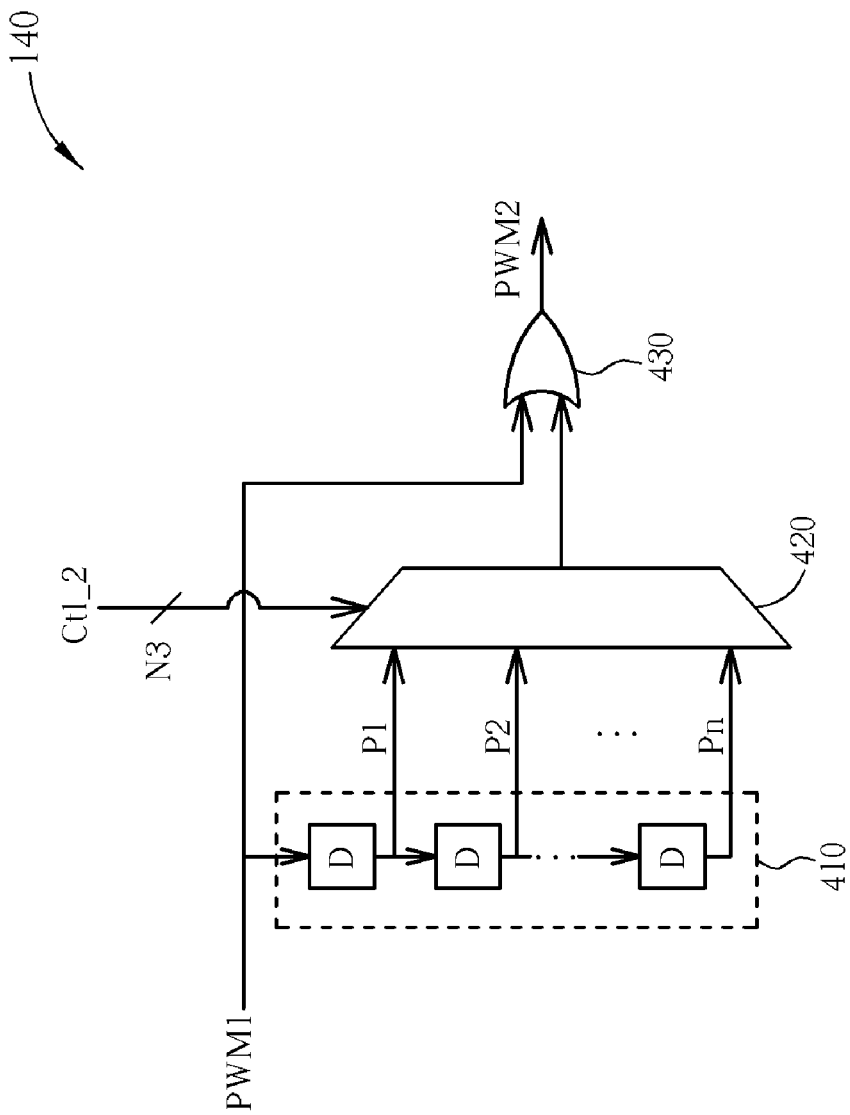
FIG. 4 is a simplified diagram of a pulse width adjuster in FIG. 1 according to a first embodiment of the present invention.

FIG. 4 is a simplified diagram of the pulse width adjuster 140 according to a first embodiment of the present invention. The pulse width adjuster 140 in this embodiment includes a phase shifter 410, a multiplexer 420 and an OR Gate 430. The phase shifter 410 is utilized to generate a plurality of delay signals according to the first PWM signal PWM1. In this embodiment, the phase shifter 410 utilizes a delay chain composed of n delay stages to delay the first PWM signal PWM1 in order to generate n delay signals P1~Pn, where $n = 2^{N3} - 1$. In one embodiment, a delay amount of each delay stage in the phase shifter 410 is $1/(F2 \times 2^{N3})$. Therefore, the phase difference between any two adjacent delay signals of the delay signals P1~Pn is $1/(F2 \times 2^{N3})$. It should be noted that this is only an embodiment of the present invention and is not intended to be a limitation of the delay amount setting of each delay stage of the phase shifter 410.

The multiplexer 420 selects one delay signal from the delay signals P1~Pn as its output according to the value of the second control signal Ctl_2. For example, in one embodiment, the multiplexer 420 outputs a logic "0" signal when the value of the second control signal Ctl_1 is 0; outputs the delay signal P1 when the value of the second control signal Ctl_1 is 1; outputs the delay signal P2 when the value of the second control signal Ctl_1 is 2; outputs the delay signal Pn when the value of the second control signal Ctl_1 is $2^{N3} - 1$, and so on.

Next, the OR Gate 430 of the pulse width adjuster 140 performs a logic OR calculation on the first PWM signal PWM1 and the output of the multiplexer 420 to generate the second PWM signal PWM2.

As can be seen, when the value of the second control signal Ctl_2 is 0, the second PWM signal PWM2 outputted by the OR Gate 430 is substantially the same as the first PWM signal PWM1, but when the value of the second control signal Ctl_2 is not 0, the pulse width of the second PWM signal PWM2 is greater than that of the first PWM signal PWM1 since the high logic level periods of the first PWM signal PWM1 and the delay signal Pi (I=1~n) selected by the multiplexer 420 may not completely overlap. That is, the pulse width adjuster 140 in this embodiment decides whether the output pulse width of the PWM circuit 130 is increased according to the second control signal Ctl_2 outputted by the controlling module 120 to form the second PWM signal PWM 2.

In next step 250, the audio power amplifier 100 uses the second PWM signal PWM2 generated by the controller 102 to drive the power stage 160. Since the operation of controlling a power stage by a PWM signal is well known, further description is omitted for the sake of brevity.

In the controller 102 of the audio power amplifier 100, if the N4-bit modulated signal M0 generated by the sigma delta modulator 310 of the controlling module 120 is directly utilized as an input signal to the PWM circuit 130, the operation frequency of the PWM circuit 130 must be increased to $2^{N4} \times F1$, which significantly raises the production difficulty and cost of the PWM circuit 130. Decomposing the modulated signal M0 output from the delta sigma modulator 310 into the first control signal Ctl_1 and the second control signal Ctl_2 having a lower bit number by the decision unit 320 can lower the working frequency of the PWM circuit 130 and therefore reduce the production complexity and cost. On the other hand, because the pulse width adjuster 140 of the controller 102 finely adjusts the output pulse width of the PWM circuit 130 according to the second control signal Ctl_2, the resolution of the second PWM signal PWM2 is very close to the resolution of a PWM signal generated by the PWM circuit 130 according to the N4-bit modulated signal M0 at a working frequency of $2^{N4} \times F1$. In other words, the configuration of the above-mentioned controller 102 can significantly lower the operation frequency of the PWM circuit 130 without affecting the overall performance of the audio power amplifier 100. From another point of view, compared to a conventional controller including the same PWM circuit 130, the controller 102 disclosed above has a better output pulse width resolution, thereby efficiently improving the performance of the audio power amplifier.

Figure 5:
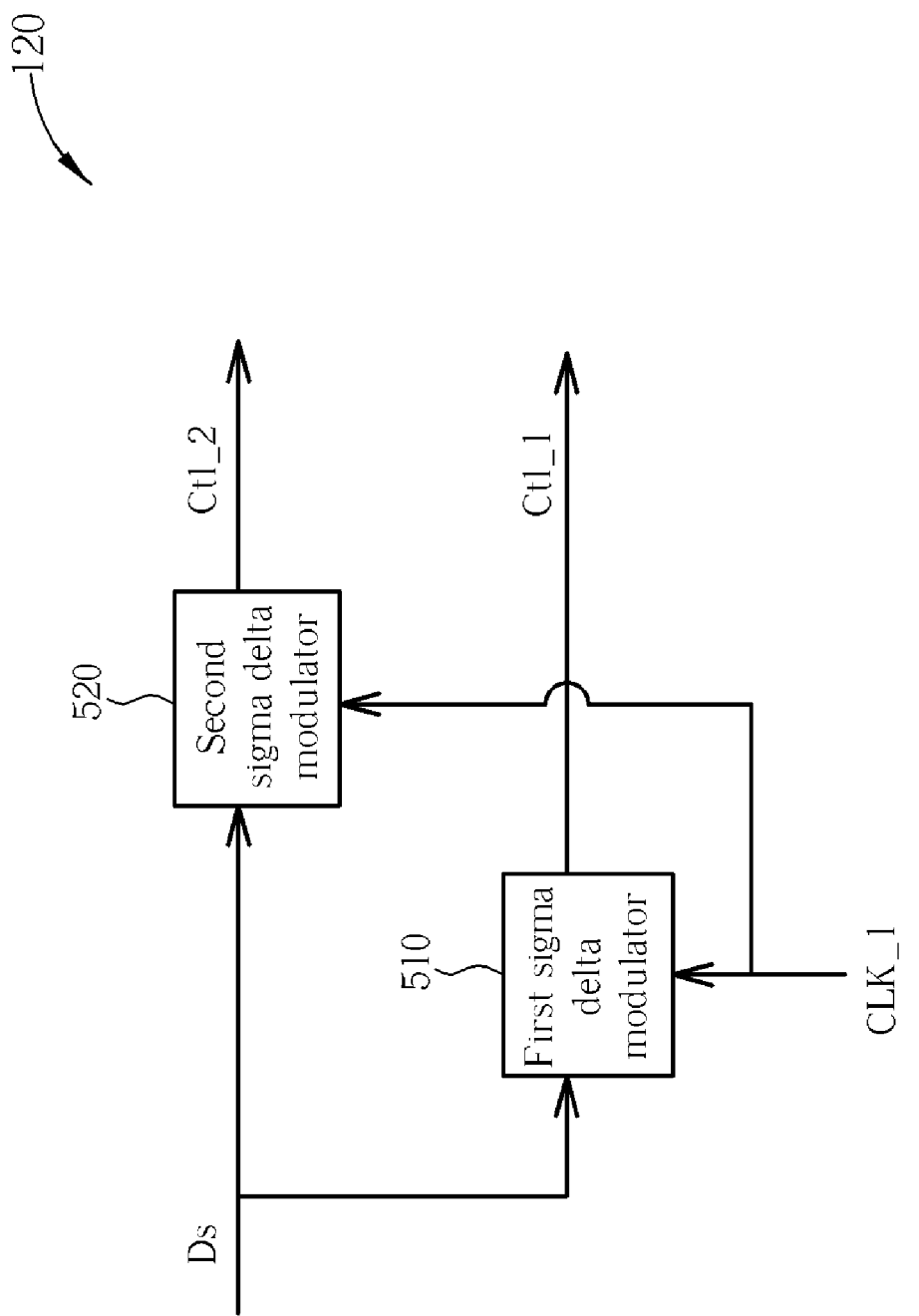
FIG. 5 is a simplified diagram of the controlling module in FIG. 1 according to a second embodiment of the present invention.

Please refer to FIG. 5, which illustrates a simplified diagram of the controlling module 120 according to a second embodiment of the present invention. In this embodiment, the controlling module 120 comprises an N2-bit first sigma delta modulator 510 and an N4-bit second sigma delta modulator 520, where $N4 = N2 + N3$. The first sigma delta modulator 510 is for performing a first sigma delta modulation on the oversampled signal Ds to generate the N2-bit first control signal Ctl_1. The second sigma delta modulator 520 is for performing a second sigma delta modulation on the oversampled signal Ds to generate an N4-bit modulated signal, and uses N3 least significant bits of the modulated signal as the second control signal Ctl_2. Due to the N2-bit first control signal Ctl_1 generated by the first sigma delta modulator 510 being equivalent to the N2 most significant bits of the modulated signal generated by the second sigma delta modulator 520, the controlling module 120 in FIG. 5 is substantially equal to the embodiment shown in FIG. 3. In this situation, the pulse width adjuster 140 can be implemented by the embodiment shown in FIG. 4 as well.

In the above embodiments, the pulse width adjuster 140 decides whether the output pulse width of the PWM circuit 130 is increased according to the second control signal Ctl_2 output by the controlling module 120 to generate the second PWM signal PWM2. However, this is only an embodiment and not meant to be a limitation of the present invention. Taking the controlling module 120 shown in FIG. 3 as an example, when the decision unit 320 receives the N4(=N2+N3)-bit modulated signal M0 output from the sigma delta modulator 310, it can add 1 to the value representing the N2 most significant bits of the modulated signal M0 to form the value of the first control signal Ctl_1, and subtract the value representing N3 least significant bits from $2^{N3}$ to form the value of the second control signal Ctl_2. Compared to the above embodiments, the value of the first control signal Ctl_1 is larger, therefore a first PWM signal PWM1' output by the PWM circuit 130 has a broader pulse width. In this situation, the pulse width adjuster 140 can be implemented by the embodiment shown in FIG. 6.

Figure 6:
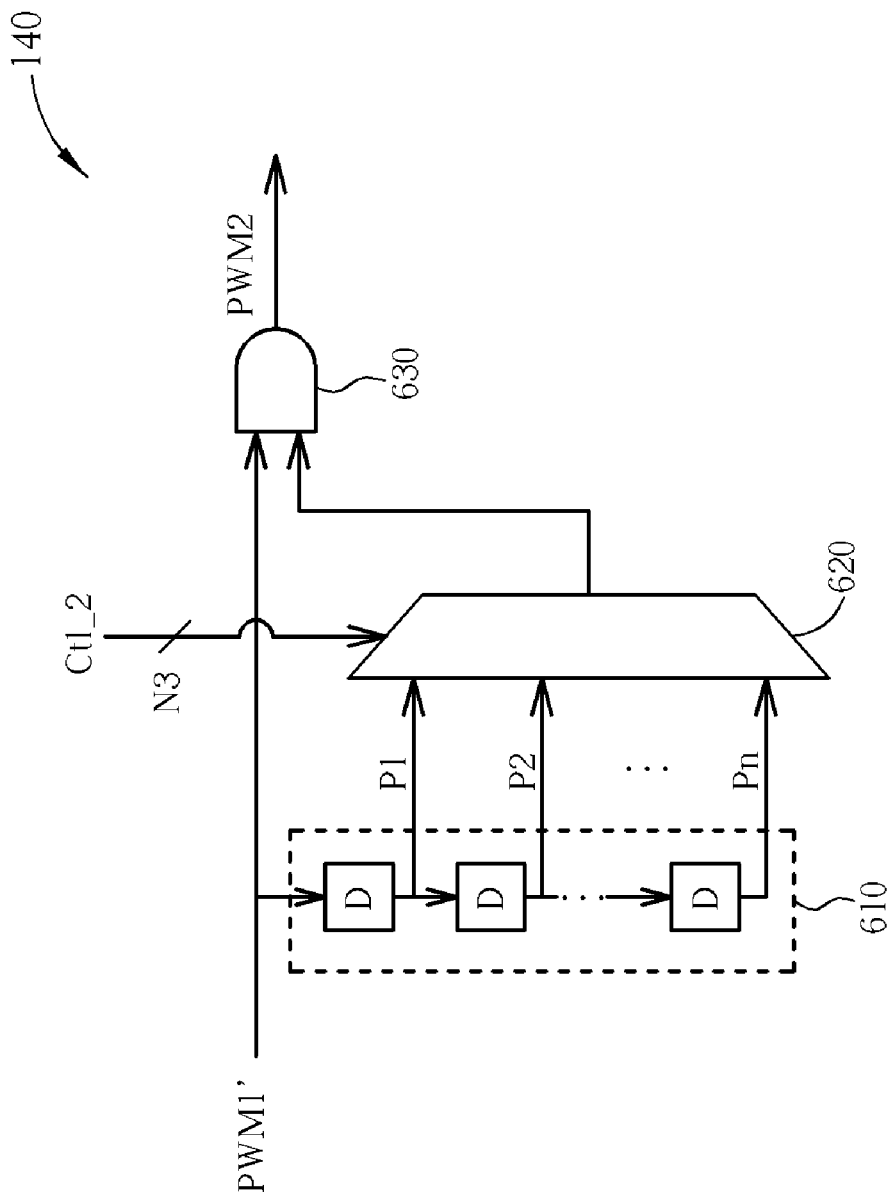
FIG. 6 is a simplified diagram of the pulse width adjuster in FIG. 1 according to a second embodiment of the present invention.

As shown in FIG. 6, the pulse width adjuster 140 of this embodiment includes a phase shifter 610, a multiplexer 620 and an AND Gate 630. The operation of the phase shifter 610 is substantially the same as the phase shifter 410 in FIG. 4, hence a repeated description is omitted for the sake of brevity. In this embodiment, the multiplexer outputs a logic "1" signal when the value of the second control signal Ctl_2 is 0, outputs the delay signal P1 when the value of the second control signal Ctl_2 is 1, outputs the delay signal P2 when the value of the second control signal Ctl_2 is 2, outputs the delay signal Pn when the value of the second control signal Ctl_2 is $2^{N3}-1$, and so on.

The AND Gate 630 is for performing a logic AND calculation on the first PWM signal PWM1' and the output of the multiplexer 620 to generate the second PWM signal PWM2. More specifically, when the value of the second control signal Ctl_2 is 0, the second PWM signal PWM2 output from the AND Gate 630 is substantially the same as the first PWM signal PWM1', but when the value of the second control signal Ctl_2 is not 0, the pulse width of the second PWM signal PWM2 output by the AND gate 630 is smaller than the pulse width of the first PWM signal PWM1'. In other words, the pulse width adjuster 140 in this embodiment decides whether the output pulse width of the PWM circuit 130 is decreased according to the second control signal Ctl_2 outputted by the controlling module 120 to generate the second PWM signal PWM2.

Please refer to FIG. 3 again. In another embodiment, when the decision unit 320 of the controlling module 120 receives the N4(=N2+N3)-bit modulated signal M0 outputted by the sigma delta modulator 310, the decision unit 320 generates a (N2+1)-bit first control signal Ctl_1 according to N2 most significant bits of the modulated signal M0. The N2 most significant bits of the first control signal Ctl_1 is the same as the N2 most significant bits of the modulated signal M0, and the least significant bit of the first control signal Ctl_1 is fixed to 1. In this embodiment, the decision unit 320 subtracts $2^{N3-1}$ from the value representing N3 least significant bits of the modulated signal M0 to generate an N3-bit second control signal Ctl_2, wherein the most significant bit of the second control signal Ctl_2 is a sign bit. For example, assuming N3=3, if the N3 least significant bits of the modulated signal M0 represent a value 7, then the value of the second control signal Ctl_2 outputted by the decision unit 320 is 3, which is a bit sequence ⌈011⌉; if the N3 least significant bits of the modulated signal M0 represent a value 4, then the bit sequence of the second control signal Ctl_2 is ⌈000⌉; if the N3 least significant bits of the modulated signal M0 represent a value of 1, then the bit sequence of the second control signal Ctl_2 outputted by the decision unit 320 is ⌈101⌉; and if the N3 least significant bits of the modulated signal M0 represent a value of 0, then the bit sequence of the second control signal Ctl_2 outputted by the decision unit 320 is ⌈100⌋.

In this embodiment, the PWM circuit 130 outputs a first PWM signal PWM1'' whose pulse width is between the above-mentioned PWM signal PWM1 and PWM1'. In this situation, the pulse width adjuster 140 can be implemented by the embodiment shown in FIG. 7.

Figure 7:
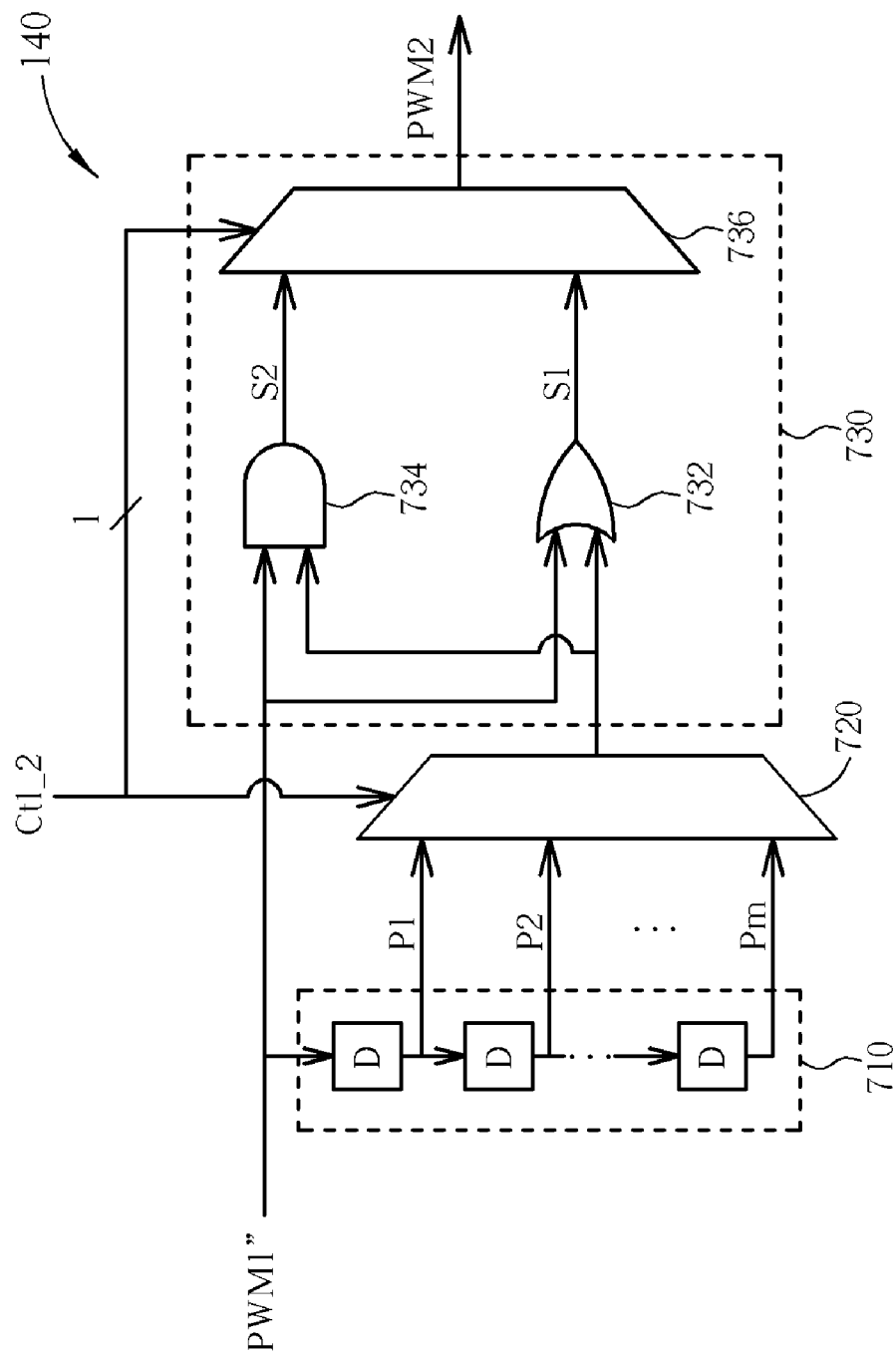
FIG. 7 is a simplified diagram of the pulse width adjuster in FIG. 1 according to a third embodiment of the present invention.

As shown in FIG. 7, the pulse width adjuster 140 in this embodiment includes a phase shifter 710, a multiplexer 720 and a combinational logic circuit 730. The phase shifter comprises m delay stages, and is for delaying the first PWM signal PWM1' to generate m delay signals P1~Pm, where m=$2^{N3-1}$. The multiplexer 720 selects one delay signal out from the plurality of delay signals P1~Pm as its output according to the value of the second control signal Ctl_2. In order to simplify the explanation, the following takes 3 as an example of N3 as above. In this embodiment, assuming m=4, when the bit sequence of the second control signal Ctl_2 is ⌈000⌋, the multiplexer 720 outputs a logic "0" signal; when the bit sequence of the second control signal Ctl_2 is ⌈001⌋or ⌈110⌋, the output of the multiplexer 720 is the delay signal P2; when the bit sequence of the second control signal Ctl_2 is ⌈100⌋, the multiplexer 720 outputs the delay signal Pm, and so on. Then, the combinational logic circuit 730 performs a logic AND calculation or a logic OR calculation on the first PWM signal PWM1'' and the output of the multiplexer 720 according to the sign bit of the second control signal Ctl_2 to generate the second PWM signal PWM2.

As shown in FIG. 7, the combinational logic circuit 730 in this embodiment comprises an OR Gate 732 for performing a logic OR calculation on the first PWM signal PWM'' and the output of the multiplexer 720 to generate a first signal S1; an AND Gate 734 for performing a logic AND calculation on the first PWM signal PWM'' and the output of the multiplexer 720 to generate a second signal S2; and a multiplexer 736 for selecting one of the first signal S1 and the second signal S2 as the second PWM signal PWM2 according to the sign bit of the second control signal Ctl_2. In this embodiment, when the sign bit of the second control signal Ctl_2 is ⌈0⌋, the multiplexer 736 outputs the first signal S1 as the second PWM signal PWM2, and when the sign bit of the second control signal Ctl_2 is ⌈1⌋, the multiplexer 736 outputs the second signal S2 as the second PWM signal PWM2. As can be seen, the pulse width adjuster 140 in this embodiment increases or decreases the output pulse width of the PWM circuit 130 according to the second control signal Ctl_2 outputted by the controlling module 120 to form the second PWM signal PWM2.

Figure 8:
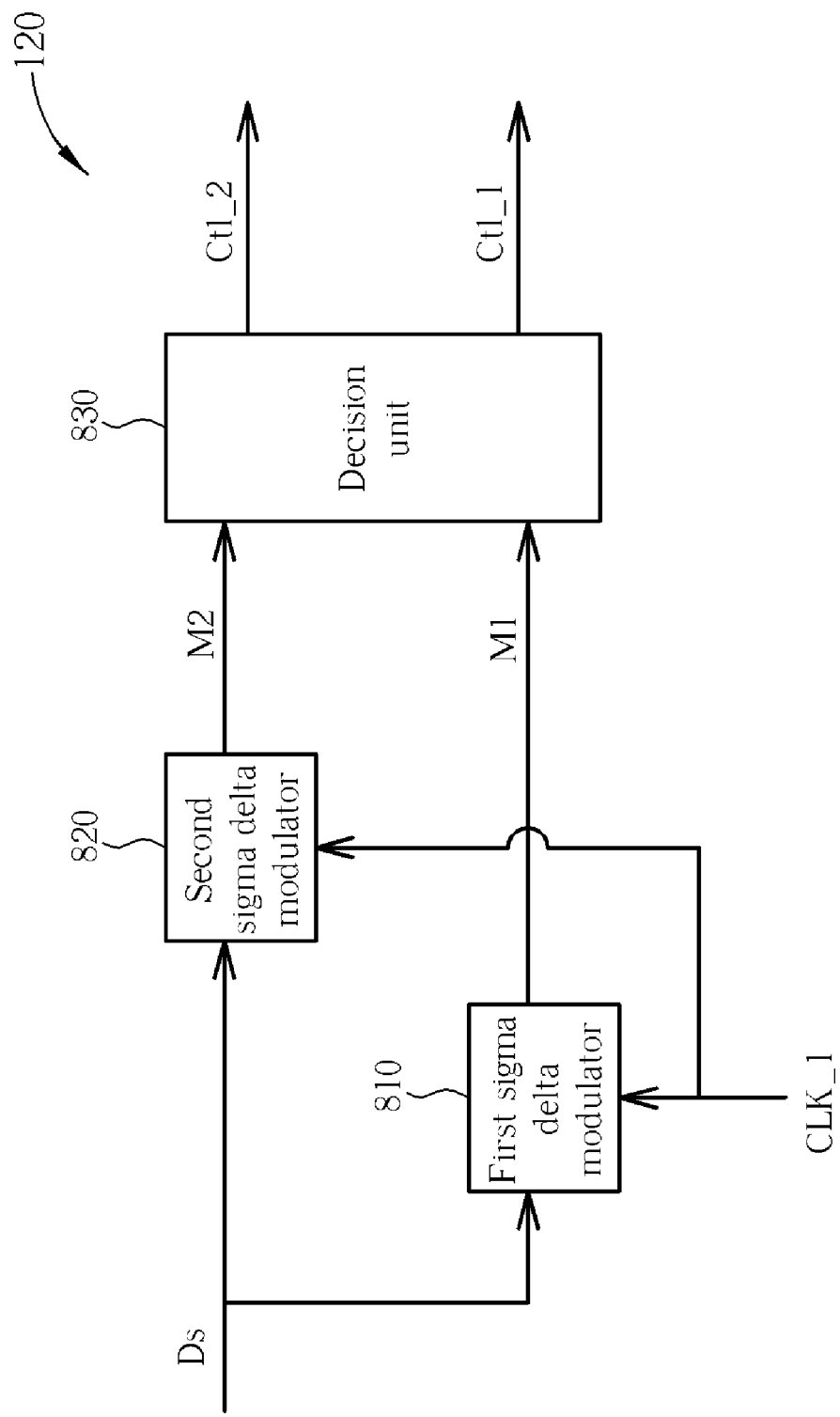
FIG. 8 is a simplified diagram of the controlling module in FIG. 1 according to a third embodiment of the present invention.

Please refer to FIG. 8, which is a simplified diagram of the controlling module 120 according to a third embodiment of the present invention. In this embodiment, the controlling module 120 includes an N2-bit first sigma delta modulator 810, an N4-bit second sigma delta modulator 820, and a decision unit 830, where N4=N2+N3. The first sigma delta modulator 810 is utilized to perform a first sigma delta modulation on the oversampled signal Ds to generate an N2-bit first modulated signal M1. The second sigma delta modulator 820 is utilized to perform a second sigma delta modulation on the oversampled signal Ds to generate an N4-bit second modulated signal M2. Then, the decision unit 830 generates a first control signal Ctl_1 according to the first modulated signal M1, and generates a second control signal Ctl_2 according to at least one least significant bit of the second modulated signal M2.

In one embodiment, the decision unit 830 generates a (N2+1)-bit first control signal Ctl_1 according to the first modulated signal M1, wherein N2 most significant bits of the first control signal Ctl_1 are the N2 bits of the first modulated signal M1, and the least significant bit of the first control signal Ctl_1 is fixed to 1. Moreover, the decision unit 830 subtracts $2^{N3-1}$ from the value representing N3 least significant bits of the second modulated signal M2 to generates an N2-bit second control signal Ctl_2, wherein the most significant bit of the second control signal Ctl_2 is a sign bit. Since the technique of the decision unit 830 generating the first control signal Ctl_1 and the second control signal Ctl_2 are substantially the same as the embodiments disclosed above, the pulse width adjuster 140 cooperating with the controlling module 120 in FIG. 8 can be implemented by the embodiment of FIG. 7.

When implementing, a low pass filter (such as a digital low pass filter, not shown in the figures) can be disposed between the oversampler 110 and the controlling module 120 of the controller 102 mentioned above to low-pass filter the oversampled signal Ds outputted by the oversampler 110 in order to increase sampling points of the oversampled signal Ds. For example, the low pass filter can increase the sampling points of the oversampled signal Ds by interpolation. From one aspect, the low pass filter can make the shape of the oversampled output signal smoother, and therefore the overall performance of the controller 102 can be further improved. Please note that the low pass filter can also be integrated in a same hardware element with the oversampler 110 or the controlling module 120.

Those skilled in the art will readily observe that numerous modifications and alterations of the device and method may be made while retaining the teachings of the invention.

What is claimed is:

1. A controller of a power amplifier, comprising:
   an oversampler, for oversampling an incoming digital signal to generate an oversampled signal;
   a controlling module, for generating a first control signal and a second control signal according to the oversampled signal;
   a pulse width modulation (PWM) circuit, for generating a first PWM signal according to the first control signal; and
   a pulse width adjuster, for adjusting a pulse width of the first PWM signal according to the second control signal to generate a second PWM signal for controlling a power stage of the power amplifier.

2. The controller of claim 1, wherein the controlling module comprises:
   a sigma delta modulator, for performing a sigma delta modulation on the oversampled signal to generate a first modulated signal; and
   a decision unit, for generating the first control signal and the second control signal according to the first modulated signal.

3. The controller of claim 2, wherein the decision unit generates the first control signal according to a plurality of most significant bits of the first modulated signal, and generates the second control signal according to at least one least significant bit of the first modulated signal.

4. The controller of claim 3, wherein the decision unit is a de-multiplexer.

5. The controller of claim 1, wherein the controlling module comprises:
   a first sigma delta modulator, for performing a first sigma delta modulation on the oversampled signal to generate the first control signal; and
   a second sigma delta modulator, for performing a second sigma delta modulation on the oversampled signal to generate a second modulated signal, where a bit number of the second modulated signal is greater than that of the first control signal, and the second sigma delta modulator further utilizes at least one least significant bit of the second modulated signal as the second control signal.

6. The controller of claim 1, wherein the controlling module comprises:
   a first sigma delta modulator, for performing a first sigma delta modulation on the oversampled signal to generate a third modulated signal;
   a second sigma delta modulator, for performing a second sigma delta modulation on the oversampled signal to generate a fourth modulated signal having a bit number being greater than that of the third modulated signal; and
   a decision unit, for generating the first control signal according to the third modulated signal and generating the second control signal according to at least one least significant bit of the fourth modulated signal.

7. The controller of claim 1, wherein the pulse width adjuster comprises:
   a phase shifter, for generating a plurality of delay signals according to the first PWM signal;
   a multiplexer, coupled to the phase shifter, for selecting one of the plurality of delay signals as an output according to the second control signal; and
   a logic circuit, coupled to the multiplexer, for performing a logic calculation on the first PWM signal and the output of the multiplexer to generate the second PWM signal.

8. The controller of claim 7, wherein the logic circuit is an OR Gate.

9. The controller of claim 7, wherein the logic circuit is an AND Gate.

10. The controller of claim 7, wherein the logic circuit is a combinational logic circuit.

11. The controller of claim 1, wherein a bit number of the first control signal is less than that of the oversampled signal.

12. The controller of claim 1, further comprising a low pass filter, for increasing sampling points of the oversampled signal.

13. A method for controlling a power stage of a power amplifier, comprising:
   oversampling an incoming digital signal to generate an oversampled signal;
   generating a first control signal and a second control signal according to the oversampled signal;
   generating a first pulse width modulation (PWM) signal according to the first control signal; and
   adjusting a pulse width of the first PWM signal according to the second control signal to generate a second PWM signal for controlling the power stage.

14. The method of claim 13, wherein the step of generating the first control signal and the second control signal comprises:
   performing a sigma delta modulation on the oversampled signal to generate a first modulated signal; and
   generating the first control signal and the second control signal according to the first modulated signal.

15. The method of claim 14, wherein the step of generating the first control signal and the second control signal comprises:
   generating the first control signal according to a plurality of most significant bits of the first modulated signal; and generating the second control signal according to at least one least significant bit of the first modulated signal.

16. The method of claim 13, wherein the step of generating the first control signal and the second control signal comprises:
- performing a first sigma delta modulation on the oversampled signal to generate the first control signal; and
- performing a second sigma delta modulation on the oversampled signal to generate a second modulated signal having a bit number greater than that of the first control signal; and
- utilizing at least one least significant bit of the second modulated signal as the second control signal.

17. The method of claim 13, wherein the step of generating the first control signal and the second control signal comprises:
- performing a first sigma delta modulation on the oversampled signal to generate a third modulated signal;
- performing a second sigma delta modulation on the oversampled signal to generate a fourth modulated signal having a bit number greater than that of the third modulated signal;
- generating the first control signal according to the third modulated signal; and
- generating the second control signal according to at least one least significant bit of the fourth modulated signal.

18. The method of claim 13, wherein the step of generating the second PWM signal comprises:
- delaying the first PWM signal to generate a plurality of delay signals;
- selecting one of the plurality of delay signals as a selected delay signal according to the second control signal; and
- performing at least one logic calculation on the first PWM signal and the selected delay signal to generate the second PWM signal.

19. The method of claim 13, wherein a bit number of the first control signal is less than that of the oversampled signal.

20. The method of claim 13, wherein the step of generating the first control signal and the second control signal according to the oversampled signal comprises:
- low-pass filtering the oversampled signal before generating the first control signal and the second control signal according to the oversampled signal.

21. A power amplifier, comprising:
- an oversampler, for oversampling an incoming digital signal to generate an oversampled signal;
- a controlling module, coupled to the oversampler, for generating a first control signal and a second control signal according to the oversampled signal, wherein the first control signal has a bit number less than that of the oversampled signal;
- a pulse width modulation (PWM) circuit, coupled to the controlling module, for generating a first PWM signal according to the first control signal;
- a power stage; and
- a pulse width adjuster, couple to the controlling module, the PWM circuit and the power stage, for adjusting a pulse width of the first PWM signal according to the second control signal to generate a second PWM signal for driving the power stage.

* * * * *